United States Patent
Jang et al.

(10) Patent No.: US 11,171,302 B2
(45) Date of Patent: Nov. 9, 2021

(54) ORGANIC ELECTROLUMINESCENT DEVICE

(71) Applicant: ROHM AND HAAS ELECTRONIC MATERIALS KOREA LTD., Chungcheongnam-do (KR)

(72) Inventors: Sung-Woo Jang, Gyeonggi-do (KR); Dong-Hyung Lee, Gyeonggi-do (KR); Sang-Hee Cho, Gyeonggi-do (KR); Nam-Kyun Kim, Gyeonggi-do (KR)

(73) Assignee: Rohm and Haas Electronic Materials Korea Ltd.

( * ) Notice: Subject to any disclaimer, the term of this patent is extended or adjusted under 35 U.S.C. 154(b) by 63 days.

(21) Appl. No.: 16/610,536

(22) PCT Filed: May 31, 2018

(86) PCT No.: PCT/KR2018/006210
§ 371 (c)(1),
(2) Date: Nov. 4, 2019

(87) PCT Pub. No.: WO2018/221978
PCT Pub. Date: Dec. 6, 2018

(65) Prior Publication Data
US 2021/0159444 A1    May 27, 2021

(30) Foreign Application Priority Data

May 31, 2017 (KR) .......................... 10-2017-0067654
May 16, 2018 (KR) .......................... 10-2018-0056164

(51) Int. Cl.
*H01L 51/52* (2006.01)
*H01L 51/50* (2006.01)

(52) U.S. Cl.
CPC ...... *H01L 51/5218* (2013.01); *H01L 51/5056* (2013.01); *H01L 51/5072* (2013.01); *H01L 51/5092* (2013.01); *H01L 2251/558* (2013.01)

(58) Field of Classification Search
CPC ............. H01L 51/5218; H01L 51/5072; H01L 51/5092; H01L 51/5056
See application file for complete search history.

(56) References Cited

U.S. PATENT DOCUMENTS 7,595,586 B2    9/2009  Oh et al.
8,471,463 B2    6/2013  Sumida et al.
(Continued)

FOREIGN PATENT DOCUMENTS

CN    103928634 A    7/2014

OTHER PUBLICATIONS

Kristian O. Sylvester-Hvid, "Frequency-Dependent Molecular Polarizability and Refractive Index: Are Substituent Contributions Additive?", J. phys. Chem. A. 1999, vol. 103, Issue 12, 1818-1821.
(Continued)

*Primary Examiner* — Anthony Ho
(74) *Attorney, Agent, or Firm* — G. Creston Campbell (57) ABSTRACT

The present disclosure relates to an organic electroluminescent device comprising an organic electroluminescent compound of high refractive index. According to the present disclosure, an organic electroluminescent device having decreased thickness while implementing a desired color coordinate, or implementing deeper color coordinate in the same device thickness can be provided. As such, the production efficiency of the device can be increased by decreasing the material amount used in the organic electroluminescent device or a broader light-emitting zone can be obtained due to deeper color characteristic in the same device thickness.

9 Claims, 1 Drawing Sheet

(56) References Cited

U.S. PATENT DOCUMENTS

| | | | |
|---|---|---|---|
| 9,806,296 | B2 | 10/2017 | Kang et al. |
| 2006/0279833 | A1 | 12/2006 | Yoshimura et al. |
| 2009/0167165 | A1 | 7/2009 | Otsu et al. |
| 2017/0018733 | A1 | 1/2017 | Jin et al. |

OTHER PUBLICATIONS

Daisuke Yokoyama, "Molecular orientation in small-molecule organic light-emitting diodes", J. Mater. Chem., 2011, 21, 19187-19202.

ORGANIC ELECTROLUMINESCENT DEVICE

TECHNICAL FIELD

The present disclosure relates to an organic electroluminescent device comprising an organic electroluminescent compound of high refractive index.

BACKGROUND ART

An electroluminescent (EL) device is a self-light-emitting device with the advantages of providing a wider viewing angle, a greater contrast ratio, and a faster response time. The first organic EL device was developed by Eastman Kodak in 1987, by using small aromatic diamine molecules and aluminum complexes as materials for forming a light-emitting layer (see Appl. Phys. Lett. 51, 913, 1987).

An organic EL device changes electric energy into light by applying electricity into an organic light-emitting material, and commonly comprises an anode, a cathode, and a medium layer formed between the two electrodes. The medium layer of the organic EL device may include a hole injection layer, a hole transport layer, an electron blocking layer, a light-emitting layer, an electron buffer layer, a hole blocking layer, an electron transport layer, an electron injection layer, etc.; the materials used in the medium layer can be classified into a hole injection material, a hole transport material, an electron blocking material, a light-emitting material, an electron buffer material, a hole blocking material, an electron transport material, an electron injection material, etc., depending on functions. In the organic EL device, holes from an anode and electrons from a cathode are injected into a light-emitting layer by application of electric voltage, and an exciton having high energy is produced by the recombination of the holes and electrons. The organic light-emitting compound moves into an excited state by the energy and emits light from energy when the organic light-emitting compound returns to the ground state from the excited state.

Meanwhile, in order to enhance color purity and/or increase light extraction efficiency, the optical thickness of the organic electroluminescent device needs to be optimized.

Korean Patent Application Laying-Open No. KR 2016-0049157 A discloses an organic electroluminescent device of which light efficiency is enhanced and color distortion is improved by controlling refractive index and thickness of the capping layer of an organic electroluminescent device. However, said reference only discloses controlling refractive index and thickness of the multiple capping layers. Korean Patent No. KR 1496789 B1 discloses an organic electroluminescent device of which the hole transport layer consists of a material having a refractive index of 1.20 to 1.65 based on the maximum peak wavelength of the light spectrum emitted from the light-emitting layer. J. phys. Chem. A. 1999, 103, pp. 1818-1821 discloses a method of measuring refractive index of benzene substituted with halogen, and J. Mater. Chem., 2011, 21, pp. 19187-19202 discloses molecular orientation of a material comprised in a small molecule OLED and an effect of improvement of electric and optical characteristics due to the orientation.

However, said references do not specifically disclose a red light-emitting organic electroluminescent device wherein at least one layer of the hole transport zone and/or the light-emitting layer comprise an organic electroluminescent compound having a refractive index of about 1.8 or greater.

DISCLOSURE OF THE INVENTION

Problems to be Solved

The objective of the present disclosure is to provide an organic electroluminescent device having decreased thickness while implementing a desired color coordinate, or implementing deeper color coordinate characteristic in the same device thickness. In addition, the production efficiency of the device can be increased by decreasing the material amount used in the organic electroluminescent device or the device performance can be improved in the same device thickness.

Solution to Problems

As a result of intensive studies to solve the problem above, the present inventors found that the aforementioned objective can be achieved by a red light-emitting organic electroluminescent device comprising a first electrode; a second electrode facing the first electrode; and at least a hole transport zone and a light-emitting layer between the first electrode and the second electrode, wherein the hole transport zone and the light-emitting layer, respectively, consist of one or more layers, and at least one layer of the layers constituting the hole transport zone and the layers constituting the light-emitting layer, comprises an organic electroluminescent compound which has a refractive index of about 1.8 or greater.

Effects of the Invention

According to the present disclosure, without a loss of color purity, the production efficiency can be increased by decreasing the thickness of the device by decreasing the material amount used in the red light-emitting organic electroluminescent device, or a deep color of high purity can be expressed without increasing the thickness of the device.

EMBODIMENTS OF THE INVENTION

Hereinafter, the present disclosure will be described in detail. However, the following description is intended to explain the disclosure, and is not meant in any way to restrict the scope of the disclosure.

The first implementing embodiment of the present disclosure provides a red light-emitting organic electroluminescent device comprising a first electrode; a second electrode facing the first electrode; and at least a hole transport zone and a light-emitting layer between the first electrode and the second electrode, wherein the hole transport zone and the light-emitting layer, respectively, consist of one or more layers, and at least one layer of the layers constituting the hole transport zone and the layers constituting the light-emitting layer, comprises an organic electroluminescent compound which has a refractive index of about 1.8 or greater.

The second implementing embodiment of the present disclosure provides the organic electroluminescent device according to the first implementing embodiment, wherein a relative polarizability based on molecular weight calculated using equation 1 according to the present disclosure of the compound comprised in the hole transport zone having a refractive index of about 1.8 or greater, is about 30 or greater.

The third implementing embodiment of the present disclosure provides the organic electroluminescent device according to the first or second implementing embodiment, wherein a density obtained by molecular dynamics calculation of the compound comprised in the hole transport zone having a refractive index of about 1.8 or greater, is about 1.1 or greater.

The fourth implementing embodiment of the present disclosure provides the organic electroluminescent device according to any one of the first to third implementing embodiments, wherein when one of the electrodes of the first electrode and the second electrode is a reflecting film, a transmittance at a wavelength of about 620 nm of the other electrode is about 10% to about 60%.

The fifth implementing embodiment of the present disclosure provides the organic electroluminescent device according to any one of the first to fourth implementing embodiments, which emits light of which the numerical value of the x-coordinate based on CIE 1931 color coordinate is about 0.660 to about 0.750.

The sixth implementing embodiment of the present disclosure provides the organic electroluminescent device according to any one of the first to fifth implementing embodiments, wherein the numerical value is about 0.660 to about 0.700.

The term "organic electroluminescent compound" in the present disclosure means a compound that may be used in an organic electroluminescent device, and may be comprised in any material layer constituting an organic electroluminescent device, as necessary.

The term "organic electroluminescent material" in the present disclosure means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material, an electron buffer material, a hole blocking material, an electron transport material, an electron injection material, etc.

An organic electroluminescent device is classified into a bottom emission device and a top emission device depending on emission structures. An organic electroluminescent device wherein most of the light heads to the thin film transistor side is the bottom emission device, and an organic electroluminescent device wherein most of the light heads to the opposite side of the thin film transistor is the top emission device.

In order to operate an organic electroluminescent device, since a plurality of layers of a thin film transistor, a capacitor, a pixel defining layer, etc., are formed, a bottom emission device having a non-resonant structure, compared to a top emission device, has a weak point in operating the device such as low aperture ratio. An aperture ratio is a ratio of an area of which light can actually be emitted in a unit pixel. If the aperture ratio is high, the amount of the light emitted is large in the same current, and thus luminance is high. As a result, it is advantageous in terms of power consumption, and the lifespan of the device becomes longer since the deterioration due to accumulated current is reduced. Hence, a top emission device has an advantage in expressing an effective pixel.

Recently, not only studies of materials which can enhance the performance of the organic electroluminescent device, but also, particularly, studies for improving the performance of the device due to enhancement of color purity and increase of light extraction efficiency by optimizing the optical thickness between the anode and the cathode in a top emission device comprising a resonant structure, have been conducted.

In order to satisfy the effective light extraction conditions in a certain wavelength for a certain color implement, the thickness and refractive index of the device may be controlled, which are complementary to each other. Thus, when a material of high refractive index is used, reduction of material amount and improvement in process productivity are expected since the thickness of the device can be decreased. Particularly, since the thickness of a red light-emitting organic electroluminescent device is larger than a blue or green light-emitting device, the production efficiency of the device can be significantly improved by using a high refractive index material. The organic electroluminescent device of the present disclosure may be applied to a top emission device. However, it is not limited thereto, and thus it can be applied to a bottom emission device.

Specifically, when light generated from the light-emitting layer of an organic electroluminescent device is extracted to outside, it goes through many interlayers. The light which went through many interlayers can be reflected and not transmit the interlayer. As such, light is extracted to outside by going through transmissions and reflections. In addition, within the interlayers between each layer, reflections may be repeated, and much light is resonated in such process. Due to this resonance, light is amplified and the quantity of light extracted to outside is increased. Thus, luminous efficiency may be improved by the effectively amplified light generated from the light-emitting layer of an organic electroluminescent device.

When one electrode of the two electrodes is formed as a reflecting film and the other electrode is formed as a semi-transmitting film, the resonance effect is larger compared to when one electrode of the two electrodes is formed as a transmitting film. This resonance phenomenon can be optimized by controlling the optical characteristic of the material and the optical path.

For example, considering the optical path due to light refraction when passing an interlayer and Snell's law (the refraction index and the film thickness are proportional to the wavelength multiplied by integers), in order to express deep red, an optical path may be increased by increasing the thickness of the organic layer when using the same light-emitting material, or a material having high refractive index may be used.

However, when forming a thick organic layer for increasing the optical path, the amount of the material used and all supplies used in every process are increased. Thus, it is inefficient.

Accordingly, in the present disclosure, resonance effect is optimized by a thin film using a material of high refractive index, and also the desired CIE 1931 color coordinate may be achieved. Thus, an organic electroluminescent device having an advantage in terms of process is provided. In addition, since a deeper color may be obtained using a material of high refractive index in the same thickness, an organic electroluminescent device having excellent characteristic in terms of color coordinate is provided.

Figure 1:
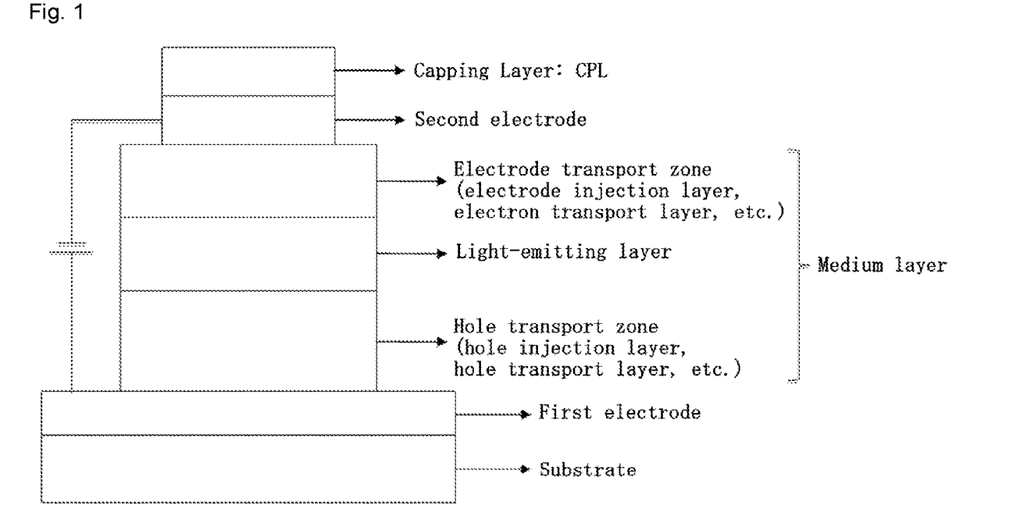
FIG. 1 is a rough schematic diagram of the organic electroluminescent device according to an embodiment of the present disclosure.

Hereinafter, the structure of the organic electroluminescent device of the present disclosure will be described by referring to FIG. 1.

According to an embodiment of the present disclosure, the organic electroluminescent device has a structure wherein a substrate, a first electrode, a medium layer, a second layer, and a capping layer are sequentially stacked from the bottom up.

One of the first electrode and the second electrode which faces each other may be an anode, and the other may be a cathode. That is, the first electrode may be an anode and the second electrode may be a cathode, and vice versa. The first electrode may be formed as a reflecting film and the second electrode may be formed as a semi-transmitting film (top emission device). However, it is not limited thereto, so the first electrode may be formed as a semi-transmitting film and the second electrode may be formed as a reflecting film (bottom emission device).

In the present disclosure, the reflecting film is sufficient by only having a function of reflecting light and includes a film having a light transmitting property. The reflecting film may consist of silver, silver alloy etc., which has high reflectivity, and may be one generally used in this technical field. Specifically, the transmissivity of the reflecting film of the present disclosure is about 50% or lower, preferably about 30% or lower, and more preferably about 10% or lower. The function as a reflecting film is effectively performed by sufficiently reflecting light when the transmissivity is below the above upper limit.

In the present disclosure, the semi-transmitting film is a film having a transmissivity of about 10% to about 60%, preferably about 20% to about 50%, which has a function enabling light extraction by reflecting some of the light as well as transmitting some of the light.

When one electrode of the first electrode and the second electrode functions as a reflecting film, the transmissivity of the other electrode at the wavelength of about 620 nm may be 10% or greater, preferably about 10% to about 60%, and more preferably about 20% to about 50%. Light can be effectively extracted by transmittance when having a higher transmissivity than the lower limit, and effective resonance can occur due to reflection when having a lower transmissivity than the upper limit.

The capping layer (CPL) formed on the second electrode protects the first electrode, medium layer, and second electrode, and enables the light generated within the medium layer to be effectively extracted to outside.

The medium layer between the first electrode and the second electrode may comprise one or more light-emitting layers and one or more hole transport zones, and may further comprise one or more electron transport zones.

The hole transport zone is a zone where holes are transported between the anode and the light-emitting layer, and may consist of one or more layers selected from the group consisting of a hole transport layer, a hole injection layer, an electron blocking layer, a hole auxiliary layer, and a light-emitting auxiliary layer. An additional layer may be comprised if necessary. Each layer may consist of one or more layers. At least one layer constituting the hole transport zone may comprise an organic electroluminescent compound which has a refractive index of about 1.8 or greater. The production efficiency of the device may be increased by effectively reducing the thickness of the layer when the refractive index is higher than the lower limit.

In addition, the light-emitting layer is a zone where electrons and holes meet between the hole transport zone and the electron transport zone thereby emitting light, and may consist of one, or two or more layers. A further layer in which materials are mixed may be comprised if necessary. At least one layer constituting the light-emitting layer may comprise an organic electroluminescent compound which has a refractive index of about 1.8 or greater. Deeper color may be implemented in the same thickness of the device when the refractive index is higher than the lower limit.

Figure 2:
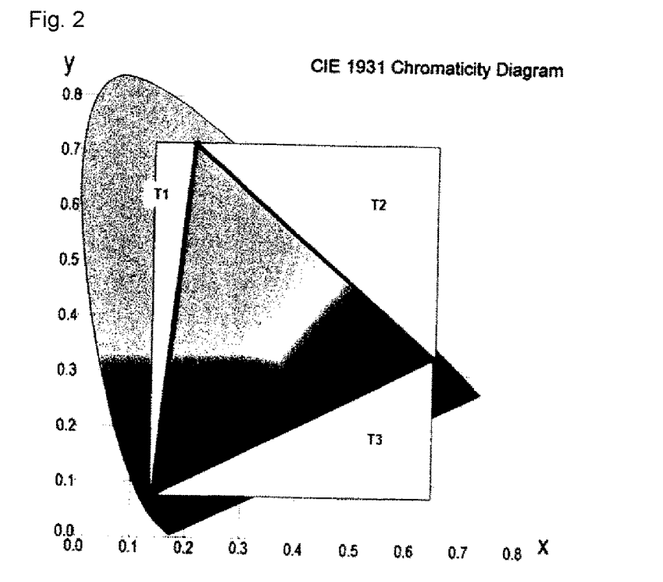
FIG. 2 is a CIE 1931 diagram.

FIG. 2 is a CIE 1931 diagram. In the case of red color, the larger the CIE X value is, the larger the area of the triangle of which the three vertexes of RGB are connected becomes. This shows the advantage of the increase of color expression zone in a display.

The hole transport layer is placed between the anode (or hole injection layer) and the light-emitting layer, enables the holes transported from the anode to be transported smoothly to the light-emitting layer, and can also function so as to block the electrons transported from the cathode to stay at the light-emitting layer. The hole injection layer may be used for lowering the hole injection barrier (or hole injection voltage) from the anode to the hole transport layer or the electron blocking layer. The electron blocking layer may be placed between the hole transport layer (or hole injection layer) and the light-emitting layer, and can confine the excitons within the light-emitting layer by blocking the overflow of electrons from the light-emitting layer to prevent a light-emitting leakage. The hole auxiliary layer may be placed between the hole transport layer (or hole injection layer) and the light-emitting layer, and may be effective to promote or block the hole transport rate (or hole injection rate), thereby enabling the charge balance to be controlled. The light-emitting auxiliary layer may be placed between the anode and the light-emitting layer, or between the cathode and the light-emitting layer. When the light-emitting auxiliary layer is placed between the anode and the light-emitting layer, it can be used for promoting the hole injection and/or hole transport, or for preventing the overflow of electrons. When the light-emitting auxiliary layer is placed between the cathode and the light-emitting layer, it can be used for promoting the electron injection and/or electron transport, or for preventing the overflow of holes. In addition, when an organic electroluminescent device includes two or more hole transport layers, the hole transport layer, which is further included, may be used as a light-emitting auxiliary layer, a hole auxiliary layer, an electron blocking layer, etc. The light-emitting auxiliary layer, the hole auxiliary layer, and/or the electron blocking layer may have an effect of improving the luminous efficiency and/or the lifespan of the organic electroluminescent device.

According to one embodiment of the present disclosure, the hole transport zone comprises a hole transport layer. Herein, the hole transport layer may comprise an organic electroluminescent compound which has a refractive index of about 1.8 or greater.

According to another embodiment of the present disclosure, the hole transport zone comprises a hole transport layer, and further comprises one or more of a hole injection layer, an electron blocking layer, a hole auxiliary layer, and a light-emitting auxiliary layer. Herein, one or more of the hole transport layer, the hole injection layer, the electron blocking layer, the hole auxiliary layer, and the light-emitting auxiliary layer may comprise an organic electroluminescent compound which has a refractive index of about 1.8 or greater.

According to yet another embodiment of the present disclosure, the light-emitting layer may consist of one, or two or more layers. Herein, one or more of the light-emitting layers may comprise an organic electroluminescent compound which has a refractive index of about 1.8 or greater.

In order to express a certain color, that is, implement a desired CIE 1931 color coordinate, the thickness of the medium layer may be varied. The thicker the hole transport zone is formed, the deeper the red color of the CIE 1931 color coordinate becomes. In addition, according to the characteristic of the material used in the hole transport zone, different thickness properties are shown in implementing a desired CIE 1931 color coordinate. In the present disclosure, in order to effectively implement the desired CIE 1931 color coordinate while inhibiting increase of thickness, at least one layer of the hole transport zone may comprise an organic electroluminescent compound which has a refractive index of about 1.8 or greater. In addition, in order to express deep red color without increase of thickness, at least one layer of the light-emitting layers may comprise an organic electroluminescent compound which has a refractive index of about 1.8 or greater.

Specifically, the present disclosure may be applied to an organic electroluminescent device which emits light of which the x coordinate value is about 0.660 to about 0.750, preferably about 0.660 to about 0.700, based on CIE 1931 color coordinate. The red light desired in the present disclosure can be implemented when the numerical value falls within the numerical scope.

Further, in the present disclosure, a relative polarizability based on molecular weight of the compound comprised in the hole transport zone having a refractive index of about 1.8 or greater may be about 30 or greater. Simultaneously or separately, a density obtained by molecular dynamics calculation of the compound comprised in the hole transport zone having a refractive index of about 1.8 or greater may be about 1.1 or greater.

Light refraction is a phenomenon of light being refracted when it goes through a boundary of different media, and is induced by a difference of light speed in the different media. In addition, the ratio of the speed of light in a medium to the speed in a vacuum is defined as refractive index. When light goes into a medium, it meets molecules constituting the medium. Light vibrates electrons present in molecules and the vibrated electrons generate light of the same frequency. Through such countless process, the speed of light becomes slower as light propagates from media, and even slower when the polarizability of a material is larger, thereby increasing interaction. Further, the larger the number of the molecules in the light path is, the slower light becomes as the number of the interactions increases. Thus, the larger the polarizability and density are, the slower light becomes and the larger the refractive index becomes.

In the present disclosure, polarizability and density of material are obtained by quantum dynamics calculation and molecular dynamics calculation, followed by finding the correlation with refractive index.

The more electrons are present in molecules or the weaker the core influence is as the electrons become farther from the core, the larger the polarizability becomes. Thus, the polarizability tends to increase as the molecular weight gets larger. Since the polarizability is affected by molecular weight, it is difficult to compare the polarizability when having different molecular weights. Accordingly, a relative polarizability (relative polarizability based on molecular weight) is defined as an off-set value at the point where the gradient is 1 in the graph wherein molecular weight is the x-axis and polarizability is the y-axis. Specifically, a relative polarizability based on molecular weight may be calculated by the following equation 1:

relative polarizability based on molecular weight=polarizability ($Bohr^3$)−molecular weight (g/mol). (Equation 1)

It was verified that compounds having a relative polarizability based on molecular weight of 30 or greater and/or density of 1.1 or greater show a refractive index of 1.8 or greater. Thus, the objective of the present disclosure may also be achieved by using in the hole transport zone a material which has a relative polarizability based on molecular weight of 30 or greater, density of 1.1 or greater, and preferably having both upon calculation. Hence, when using a high refractive index material of 1.8 or greater, reduction of material and improvement of process productivity may be obtained due to decrease of the device thickness, or improvement of device characteristic, i.e., deeper color characteristic, may be obtained in the same device thickness. The organic electroluminescent device of the present disclosure may be applied to all the blue, green, and red devices, but in particular, maximum effect may be obtained in a red device of which the device thickness is the greatest.

At least one of the light-emitting layers may comprise one or more dopant compounds and one or more host compounds.

The electron transport zone is a zone where electrons are transported between the cathode and the light-emitting layer, and may consist of one or more layers selected from the group consisting of an electron transport layer, an electron buffer layer, an electron injection layer, an interlayer, a hole blocking layer, and a light-emitting auxiliary layer. An additional layer may be comprised if necessary. Each layer may consist of one or more layers.

In order to form each layer constituting the organic EL device of the present disclosure, dry film-forming methods such as vacuum deposition, sputtering, plasma, ion plating methods, etc., or wet film-forming methods such as ink jet printing, nozzle printing, slot coating, spin coating, dip coating, flow coating methods, etc., can be used.

When using a wet film-forming method, a thin film is formed by dissolving or dispersing the material constituting each layer in suitable solvents, such as ethanol, chloroform, tetrahydrofuran, dioxane, etc. The solvents are not specifically limited as long as the material constituting each layer is soluble or dispersible in the solvents, which do not cause any problems in forming a layer.

By using the organic electroluminescent device of the present disclosure, a display device, for example, for smartphones, tablets, notebooks, PCs, TVs, or vehicles, or a lighting device, for example, an indoor or outdoor lighting device, can be produced.

Hereinafter, the preparation method of the organic electroluminescent device of the present disclosure and the luminous characteristic thereof will be explained in detail.

EXAMPLE

[Measuring Method of Refractive Index]

In order to obtain the refractive index of the organic electroluminescent material of the present disclosure, the material of which the refractive index is to be obtained was introduced into a cell of the vacuum vapor deposition apparatus, and the pressure in the chamber of the apparatus was then controlled to $10^{-6}$ torr. Thereafter, an electric current was applied to the cell to evaporate the introduced material, thereby producing a sample having a thickness of 30 nm on a silicon wafer substrate.

The refractive index was measured using an ellipsometer. Specifically, the refractive index at a wavelength of 350 to 800 nm using UVSEL of HORIBA Ltd., as the refractive index based on 620 nm at an incidence angle of 60 degrees was used.

The measured refractive index and the calculation result of quantum dynamics calculation and molecular dynamics calculation based on molecular structure of the material were compared.

[Calculation Method of Polarizability]

All the calculations of polarizability were measured by using the density functional theory (DFT) in the program of Gaussian 09. After optimizing the structure at the level of B3LYP/6-31g*, a concatenated frequency polarizability at 620 nm was calculated. The polarizability is expressed in the dipole moment change per unit electric field, and is expressed in the form of secondary rank tensor. The isotropical polarizability, which is the diagonal average in the 3×3 matrix of polarizability, was used.

[Calculation Method of Density]

Since the thin films of the organic electroluminescent device are basically amorphous, in order to simulate an amorphous state, after producing an amorphous cell with one hundred identical molecules at a density of 0.1 g/mL, molecular dynamics calculation at static pressure and static temperature was conducted. The simulation was held until the state where the density of the system was not changed.

All the calculations of density were measured by using the program Material Studio of BIOVIA Corporation.

For the calculation of density, after producing an amorphous cell with one hundred molecules at a density of 0.1 g/mL using an amorphous cell module, molecular dynamics calculation was conducted using Forcite module until the state where the density was not changed.

Examples 1 to 4: Producing a Red Light-Emitting OLED Device Comprising the High Refractive Index Material According to the Present Disclosure in at Least One Layer of the Hole Transport Zone A red light-emitting OLED device according to the present disclosure was produced as follows: An ITO/Ag/ITO glass substrate of a top emission device wherein a first electrode is formed as a reflecting film was subjected to an ultrasonic washing with acetone, ethanol, and distilled water, sequentially, and then was stored in isopropanol. Next, the glass substrate was mounted on a substrate holder of a vacuum vapor deposition apparatus. Compound HI-1 was introduced into a cell of the vacuum vapor deposition apparatus, and the pressure in the chamber of the apparatus was then controlled to $10^{-6}$ torr. Thereafter, an electric current was applied to the cell to evaporate the introduced material, thereby forming a first hole injection layer having a thickness of 65 nm on the glass substrate. Compound HI-2 was then introduced into another cell of the vacuum vapor deposition apparatus, and an electric current was applied to the cell to evaporate the introduced material, thereby forming a second hole injection layer having a thickness of 5 nm on the first hole injection layer. Compound HT-1 was introduced into another cell of the vacuum vapor deposition apparatus. Thereafter, an electric current was applied to the cell to evaporate the introduced material, thereby forming a first hole transport layer having a thickness of 65 nm on the second hole injection layer. The compounds of Table 1 below were then introduced into another cell of the vacuum vapor deposition apparatus, and an electric current was applied to the cell to evaporate the introduced materials, thereby forming a second hole transport layer having a thickness described in Table 1 below on the first hole transport layer. After forming the hole injection layers and the hole transport layers, a light-emitting layer was then deposited as follows. Compound RH-1 or RH-2 as a host was introduced into one cell of the vacuum vapor deposition apparatus and compound RD-1 as a dopant was introduced into another cell of the apparatus. The two materials were evaporated at a different rate and the dopant was deposited in a doping amount of 2 wt %, based on the total weight of the host and dopant, to form a light-emitting layer having a thickness of 40 nm on the second hole transport layer. Next, compound ET-1 and compound EI-1 were introduced into two cells and evaporated in a weight ratio of 1:1 to form an electron transport layer having a thickness of 35 nm on the light-emitting layer. After depositing compound EI-1 as an electron injection layer having a thickness of 2 nm on the electron transport layer, Mg (magnesium) and Ag (silver) were evaporated in a weight ratio of 18:1 thereby forming a second electrode having a thickness of 16 nm. Compound HI-1 was then evaporated in a thickness of 63 nm as a capping layer. Thus, an OLED device was produced.

Comparative Examples 1 to 3: Producing a Red Light-Emitting OLED Device Comprising a Conventional Low Refractive Index Material in at Least One Layer of the Hole Transport Zone OLED devices were produced in the same manner as in Examples 1 to 4, except that compounds shown in Table 1 below were used as the second hole transport material.

The driving voltage, luminous efficiency, and the X and Y values in the CIE 1931 color coordinate measured by applying voltage using a luminance meter (PR-655) of PHOTO RESEARCH Inc., at a luminance of 3,700 nits of the produced red light-emitting OLED device are provided in Table 1 below.

HI-1

HI-2

HT-1

RH-1

RH-2

RD-1

ET-1

EI-1

HT-A

HT-B

-continued

HT-C

HT-D

Examples 5 and 6: Producing a Red Light-Emitting OLED Device Comprising the High Refractive Index Material According to the Present Disclosure in at Least One Layer of the Light-Emitting Layers A red light-emitting OLED device according to the present disclosure was produced as follows: An ITO/Ag/ITO glass substrate of a top emission device wherein a first electrode is formed as a reflecting film was subjected to an ultrasonic washing with acetone, ethanol, and distilled water, sequentially, and then was stored in isopropanol. Next, the glass substrate was mounted on a substrate holder of a vacuum vapor deposition apparatus. Compound HI-1 was introduced into a cell of the vacuum vapor deposition apparatus, and the pressure in the chamber of the apparatus was then controlled to $10^{-6}$ torr. Thereafter, an electric current was applied to the cell to evaporate the introduced material, thereby forming a first hole injection layer having a thickness of 65 nm on the glass substrate. Compound HI-2 was then introduced into another cell of the vacuum vapor deposition apparatus, and an electric current was applied to the cell to evaporate the introduced material, thereby forming a second hole injection layer having a thickness of 5 nm on the first hole injection layer. Compound HT-1 was introduced into another cell of the vacuum vapor deposition apparatus. Thereafter, an electric current was applied to the cell to evaporate the introduced material, thereby forming a first hole transport layer having a thickness of 65 nm on the second hole injection layer. Compound HT-2 was then introduced into another cell of the vacuum vapor deposition apparatus, and an electric current was applied to the cell to evaporate the introduced materials, thereby forming a second hole transport layer having a thickness of 95 nm on the first hole transport layer. After forming the hole injection layers and the hole transport layers, a light-emitting layer was then deposited as follows. Compound RH-1 or RH-3 as a host was introduced into one cell of the vacuum vapor deposition apparatus and compound RD-1 as a dopant was introduced into another cell of the apparatus. The two

TABLE 1

| Item | Second hole transport material | Second hole transport material property | | Second hole transport layer thickness [nm] | Light-emitting layer (host:dopant) | Driving voltage [V] | Luminous efficiency [Cd/A] | CIE 1931 color coordinate | |
| --- | --- | --- | --- | --- | --- | --- | --- | --- | --- |
| | | Refractive index | Relative polarizability based on molecular weight | Density | | | | | CIEx | CIEy |
| Example 1 | HT-C | 1.83 | 68.37 | 1.117 | 75 | RH-1:RD-1 | 5.2 | 41.0 | 0.669 0.331 |
| Example 2 | HT-D | 1.86 | 116.07 | 1.103 | 75 | RH-1:RD-1 | 4.1 | 43.0 | 0.670 0.329 |
| Example 3 | HT-C | 1.83 | 68.37 | 1.117 | 75 | RH-2:RD-1 | 4.4 | 43.0 | 0.667 0.333 |
| Example 4 | HT-D | 1.86 | 116.07 | 1.103 | 73 | RH-2:RD-1 | 3.5 | 42.6 | 0.668 0.332 |
| Comp. Example 1 | HT-A | 1.74 | −61.54 | 1.102 | 91 | RH-1:RD-1 | 5.1 | 43.0 | 0.669 0.332 |
| Comp. Example 2 | HT-A | 1.74 | −61.54 | 1.102 | 87 | RH-2:RD-1 | 4.3 | 45.3 | 0.659 0.340 |
| Comp. Example 3 | HT-B | 1.77 | 3.93 | 1.111 | 83 | RH-2:RD-1 | 3.8 | 41.4 | 0.670 0.329 |

As in Table 1, the OLED devices according to the present disclosure emitted light of which the x coordinate value is close to 0.670 with smaller thickness compared to OLED devices using conventional materials. With this difference, the production efficiency can be significantly improved in a big scale process of mass production.

materials were evaporated at a different rate and the dopant was deposited in a doping amount of 3 wt %, based on the total weight of the host and dopant, to form a light-emitting layer having a thickness of 40 nm on the second hole transport layer. Next, compound ET-1 and compound EI-1 were introduced into two cells and evaporated in a weight ratio of 1:1 to form an electron transport layer having a thickness of 35 nm on the light-emitting layer. After depositing compound EI-1 as an electron injection layer having a thickness of 2 nm on the electron transport layer, Mg (magnesium) and Ag (silver) were evaporated in a weight ratio of 9:1 thereby forming a second electrode having a thickness of 17 nm. Compound HT-1 was then evaporated in a thickness of 83 nm as a capping layer. Thus, an OLED device was produced.

Comparative Examples 4 and 5: Producing a Red Light-Emitting OLED Device Comprising a Conventional Low Refractive Index Material in at Least One Layer of the the Light-Emitting Layers

OLED devices were produced in the same manner as in Examples 5 and 6, except that compound RH-4 or RH-5 was used as a host material of the light-emitting layer.

The driving voltage, luminous efficiency, and the X and Y values in the CIE 1931 color coordinate and EL main peak measured by applying voltage using a luminance meter (PR-655) of PHOTO RESEARCH Inc., at a luminance of 5,000 nits of the produced red light-emitting OLED device are provided in Table 2 below.

HI-1

HI-2

HT-1

HT-2

RH-1

RH-3

RH-4

RH-5

RD-1

ET-1

EI-1

TABLE 2

| Item | Host material | Refractive index (@620 nm) | EL Peak (nm) | CIE 1931 color coordinate | |
|------|---------------|----------------------------|--------------|---------|---------|
| | | | | CIEx | CIEy |
| Example 5 | RH-1 | 1.92 | 616 | 0.667 | 0.333 |
| Example 6 | RH-3 | 1.85 | 616 | 0.666 | 0.334 |
| Comparative Example 4 | RH-4 | 1.75 | 608 | 0.655 | 0.344 |
| Comparative Example 5 | RH-5 | 1.77 | 612 | 0.658 | 0.342 |

As in Table 2, the OLED devices according to the present disclosure emitted light of which the CIEx coordinate value is closer to 0.670, i.e., deeper color in the same device thickness and structure compared to OLED devices using conventional materials. This difference shows the advantage of the large increase in the color area which can be expressed in a display.

This advantage is more specifically shown in Table 3 below.

TABLE 3

| Item | Blue coordinate | Green coordinate | Red coordinate | Quadrangle (S) area | T1 area | T2 area | T3 area | Triangle area (S-T1-T2-T3) | Ratio to NTSC |
|---|---|---|---|---|---|---|---|---|---|
| NTSC standard | 0.140, 0.080 | 0.210, 0.710 | 0.670, 0.330 | 333900 | 24570 | 87400 | 66250 | 155680 | 100% |
| Example 5 | 0.140, 0.080 | 0.210, 0.710 | 0.667, 0.333 | 332010 | 24570 | 86144.5 | 66665.5 | 154630 | 99.33% |
| Example 6 | 0.140, 0.080 | 0.210, 0.710 | 0.666, 0.334 | 331380 | 24570 | 85728 | 66802 | 154280 | 99.10% |
| Comp. Example 4 | 0.140, 0.080 | 0.210, 0.710 | 0.655, 0.344 | 324450 | 24570 | 81435 | 67980 | 150465 | 96.65% |
| Comp. Example 5 | 0.140, 0.080 | 0.210, 0.710 | 0.658, 0.342 | 326340 | 24570 | 82432 | 67858 | 151480 | 97.30% |

The items in Table 3 are based on the CIE 1931 diagram of FIG. 2, and T1 to T3 of Table 3 refer to T1 to T3 of FIG. 2.

As in Table 3, as for the color coordinate characteristic of the device of Examples 5 and 6 using a high refractive index compound, the expressible area is broader compared to the color coordinate characteristic of the device of Comparative Examples 4 and 5 using a relatively low refractive index compound.

The invention claimed is:

1. A red light-emitting organic electroluminescent device comprising a first electrode; a second electrode facing the first electrode; and at least a hole transport zone and a light-emitting layer between the first electrode and the second electrode, wherein the hole transport zone and the light-emitting layer, respectively, consist of one or more layers, wherein a relative polarizability based on molecular weight calculated using the following equation 1 of the compound comprised in the hole transport zone having a refractive index of about 1.8 or greater is about 30 or greater:

relative polarizability based on molecular weight=polarizability (Bohr$^3$)–molecular weight (g/mol).  (Equation1)

2. The organic electroluminescent device according to claim 1, wherein a density obtained by molecular dynamics calculation of the compound comprised in the hole transport zone having a refractive index of about 1.8 or greater, is about 1.1 or greater.

3. The organic electroluminescent device according to claim 1, wherein when one of the electrodes of the first electrode and the second electrode is a reflecting film, a transmittance at a wavelength of about 620 nm of the other electrode is about 10% to about 60%.

4. The organic electroluminescent device according to claim 3, wherein the numerical value is about 0.660 to about 0.700.

5. The organic electroluminescent device according to claim 1, which emits light of which the numerical value of the x-coordinate based on CIE 1931 color coordinate is about 0.660 to about 0.750.

6. A red light-emitting organic electroluminescent device comprising a first electrode; a second electrode facing the first electrode; and at least a hole transport zone and a light-emitting layer between the first electrode and the second electrode, wherein the hole transport zone and the light-emitting layer, respectively, consist of one or more layers, wherein a density obtained by molecular dynamics calculation of the compound comprised in the hole transport zone having a refractive index of about 1.8 or greater, is about 1.1 or greater.

7. The organic electroluminescent device according to claim 6, wherein when one of the electrodes of the first electrode and the second electrode is a reflecting film, a transmittance at a wavelength of about 620 nm of the other electrode is about 10% to about 60%.

8. The organic electroluminescent device according to claim 7, wherein the numerical value is about 0.660 to about 0.700.

9. The organic electroluminescent device according to claim 6, which emits light of which the numerical value of the x-coordinate based on CIE 1931 color coordinate is about 0.660 to about 0.750.

* * * * *